(12) United States Patent
Ruby et al.

(10) Patent No.: US 8,510,636 B2
(45) Date of Patent: Aug. 13, 2013

(54) DYNAMIC READ CHANNEL CALIBRATION FOR NON-VOLATILE MEMORY DEVICES

(75) Inventors: Paul D. Ruby, Folsom, CA (US); Hanmant P. Belgal, El Dorado Hills, CA (US); Yogesh B. Wakchaure, Folsom, CA (US); Xin Guo, San Jose, CA (US); Scott E. Nelson, Vancouver (CA); Svanhild M. Salmons, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 235 days.

(21) Appl. No.: 13/078,226

(22) Filed: Apr. 1, 2011

(65) Prior Publication Data
US 2012/0254699 A1 Oct. 4, 2012

(51) Int. Cl.
*G11C 29/00* (2006.01)
(52) U.S. Cl.
USPC .................. 714/773; 714/784; 365/185.09
(58) Field of Classification Search
USPC ...................... 714/773; 365/185.09
See application file for complete search history.

(56) References Cited

U.S. PATENT DOCUMENTS

| 2007/0091677 | A1* | 4/2007 | Lasser et al. ............. 365/185.09 |
| 2009/0292969 | A1 | 11/2009 | Man et al. |
| 2010/0014352 | A1 | 1/2010 | Aritome |
| 2011/0231740 | A1* | 9/2011 | Lasser et al. .................. 714/773 |
| 2012/0163074 | A1* | 6/2012 | Franca-Neto et al. ..... 365/185.2 |

* cited by examiner

*Primary Examiner* — Sam Rizk
(74) *Attorney, Agent, or Firm* — Blakely, Sokoloff, Taylor & Zafman LLP

(57) ABSTRACT

Embodiments of the invention describe a dynamic read reference voltage for use in reading data from non-volatile memory cells. In embodiments of the invention, the read reference voltage is calibrated as the non-volatile memory device is used. Embodiments of the invention may comprise of logic and or modules to read data from a plurality of non-volatile memory cells using a first read reference voltage level (e.g., an initial read reference voltage level whose value is determined by the non-volatile device manufacturer). An Error Checking and Correction (ECC) algorithm is performed to identify whether errors exist in the data as read using the first read reference voltage level. If errors in the data as read are identified, a pre-determined value is retrieved to adjust the first read reference voltage level to a second read reference voltage level.

13 Claims, 5 Drawing Sheets

DYNAMIC READ CHANNEL CALIBRATION FOR NON-VOLATILE MEMORY DEVICES

FIELD

Embodiments of the invention generally pertain to computing devices and more particularly to memory device performance.

BACKGROUND

Flash memory devices are utilized as non-volatile memory for computing devices such as desktop and laptop computers, personal digital assistants (PDAs), digital cameras, tablet computers and smartphones. Flash memory devices typically utilize one-transistor memory cells, thereby allowing for high memory densities, high reliability, and low power consumption.

A common type of memory cell used by flash memory devices are NOR and NAND memory cells. Electric charges may be placed on or removed from a flash memory cell to configure the cell into a specific memory state. For example, a single level cell (SLC) may be configured to two single-bit binary states (i.e., 0 or 1). Multi-level cells (MLC) may be programmed to two-bit states (i.e., 00, 01, 10, or 11), three-bit states, and so on.

Reading a memory cell is done by assessing the stored charge of a memory cell by reading it with a read reference voltage level. A configured state of the memory cell is determined based on whether the voltage level of the stored charge is higher or lower than the read reference voltage level. For example, in an SLC, an erased state may be inferred if the voltage level of the stored charge is less than the read reference voltage level, while a programmed state may inferred if the voltage level of the stored charge is higher than the read reference voltage level (for MLCs, there may be several reference voltage levels to correspond to transitions between the plurality of memory states for the MLC).

Because the stored charge of a NAND memory cell is an analog phenomenon, its actual value may not be exactly what was intended, and it may even leak away over time; thus NAND memory units may be subject to errors when reading the data stored in the memory (i.e., the stored charge). When such errors occur while reading data from the memory, an error checking and correction (ECC) code process may be used to detect and correct the errors. Some errors may occur that cannot be corrected by the ECC process (e.g., multi-bit errors wherein the number of errors is higher than the threshold of the respective ECC code).

Errors occurring during read operations on NAND memory units may become more frequent with use. This degradation in the reliability of NAND memory is an ongoing problem. This type of problem may become worse as flash memories move increasingly to smaller geometries and to multiple-bits-per-cell structures, which are understood to have less tolerance for variations in the stored charge.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1A:
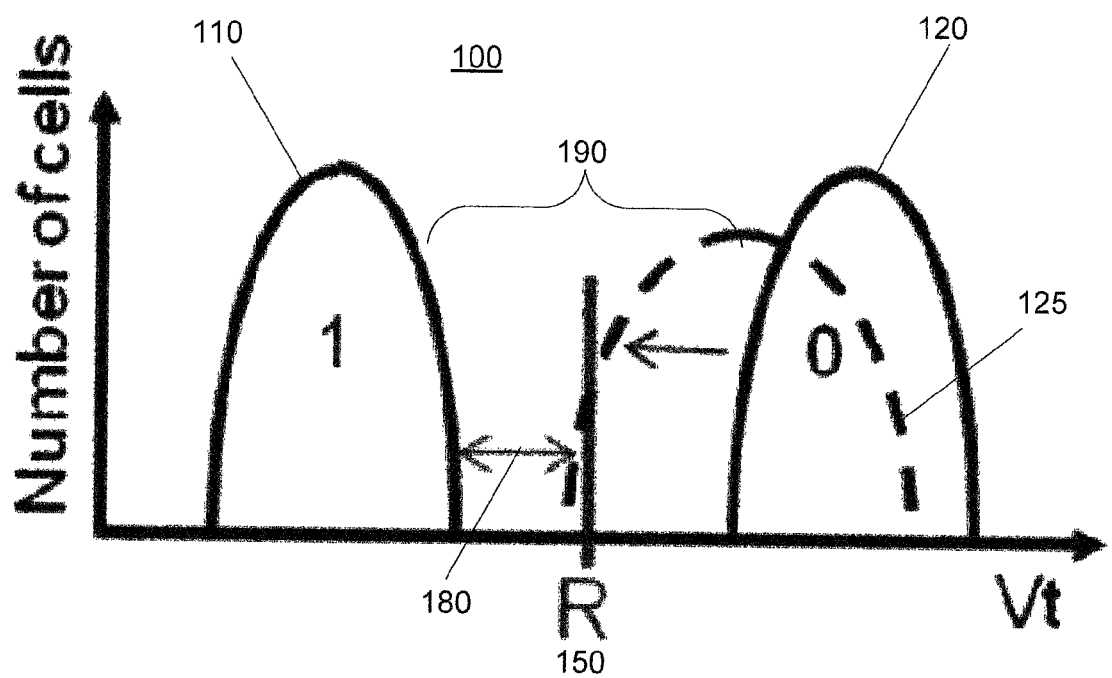
FIG. 1A and FIG. 1B are diagrams of NAND memory cell programming distributions utilized by embodiments of the invention.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

Embodiments of the invention describe a dynamic read reference voltage for use in reading data from non-volatile memory cells. In embodiments of the invention, the read reference voltage is calibrated as the non-volatile memory device is used. It will be understood based on the example embodiments described below that embodiments of the invention may increase the lifetime of memory products and enable non-volatile memory device manufacturers to trade off data reliability margins for other important technology parameters such as cost, performance and time-to-market.

As described above, prior art NAND memory devices that utilize a fixed read reference voltage have a limited product lifetime if the read channel gets altered to an extent that failed read operations to a large number of cells exceed capabilities of an Error Checking and Correction (ECC) scheme employed by the device.

Embodiments of the invention may comprise of logic and/or modules to read data from a plurality of NAND memory cells using a first read reference voltage level (e.g., an initial read reference voltage level whose value is determined by the NAND device manufacturer). An ECC algorithm is performed to identify whether errors exist in the data as read using the first read reference voltage level. Examples of such ECC algorithms may include, but are not limited to, Hamming algorithms, Reed-Solomon (RS) algorithms, Bose-Chaudhuri-Hochquenghem (BCH) algorithms, circular redundancy check (CRC) algorithms, Golay algorithms, Reed-Muller algorithms, Goppa algorithms, and Denniston algorithms.

If errors in the data as read are identified, a pre-determined value is retrieved to adjust the first read reference voltage level to a second read reference voltage level. In one embodiment, when the errors identified via the ECC algorithm are uncorrectable errors, the data from the plurality of NAND memory cells is re-read using the second read reference voltage level. It is understood that in some instances, no uncorrectable errors will be present using this second read reference voltage level; however, if uncorrectable errors still exist (whether the same amount, increased or decreased), a second pre-determined value is retrieved to adjust the read reference voltage level to a third read reference voltage level. Such a process may be repeated until no uncorrectable errors result for a read operation to the data, or all pre-determined values to adjust the read reference voltage level are exhausted.

In one embodiment of the invention, when the errors identified via the ECC algorithm are correctable errors, a determination is made as to which memory cell configured state corresponds to the most errors identified and corrected via the ECC algorithm (e.g., in single-level cell (SLC) cells, this would be either the configured binary state representing '0' or the configured binary state representing '1'). A pre-determined value is retrieved to adjust the read reference voltage level to "even out" the correctable errors between the memory cell configured states on subsequent read operations.

It is to be understood that while example embodiments of the invention described below discuss NAND memory devices, embodiments of the invention may be implemented for NOR memory devices in a similar manner.

Figure 1B:
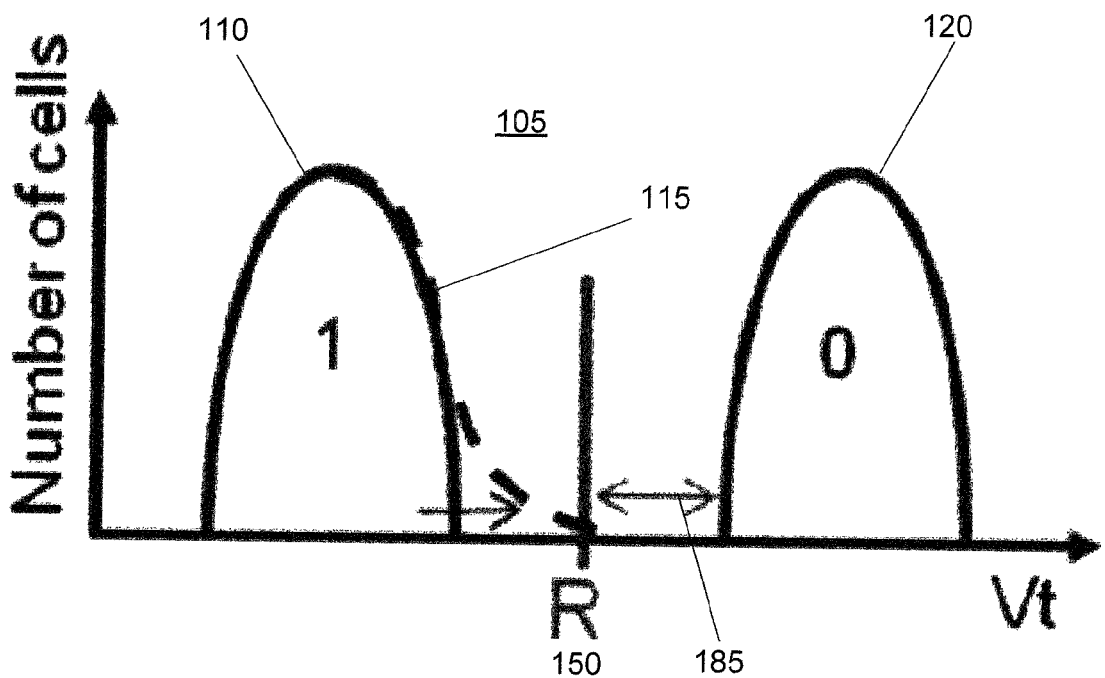

FIG. 1A and FIG. 1B are diagrams of NAND memory cell programming distributions utilized by embodiments of the invention. Graph 100 (and graph 105) shows an example distribution of a typical threshold voltage, Vt, for NAND flash memory cells in a 1 bit/cell (i.e., SLC) product, programmed with a random pattern of 1's and 0's. The voltage applied to the NAND memory cells to sense or read the data stored in the cells (i.e., the voltage used to compare the voltage level of the stored charge in each memory cell) is read reference voltage R 150. In this embodiment, R 150 is initially optimally placed roughly at the midpoint of the Vt range, known as the read margin valley or window (shown as valley 190), separating erased curve 110 (corresponding to "1" data) and programmed curve 120 (corresponding to "0" data) cells. Thus, it is understood that, initially, the probability of a failure to read the data of a cell with read reference R 150 is about equal for both erased (1→0 fail) and programmed (0→1 fail) cells. In other words, the read reference is such that read window 190 is "balanced" or "calibrated."

It is understood that there are certain mechanisms that may reduce the read margin on one or both sides of read reference R 150, and potentially alter the read channel. When a sufficiently large part of the distribution of cells crosses the read reference level R 150 (as shown in widened erased curve 115 in graph 105 and skewed programmed curve 125 in graph 100), those cells fail to read properly. Significant failures may lead to product failure and degraded reliability.

There are well understood examples of adverse mechanisms or effects that may alter the read channel and potentially reduce the read margin window. Cross-temperature operation, where the cells are written at one temperature and read at another, may skew the read channel and increase the amount of errors for read operations. Furthermore, flash memories have known reliability degradation mechanisms that may shift the erase and/or program distributions up or down. For example, a configuration state may be widened, or develop a tail, as shown in widened erased curve 115. Process and usage variability may further alter the read channel of one set of cells, such as cells forming one ECC code-word, from another.

Moreover, it is understood that these adverse effects worsen as the complexity of the respective NAND cell technology increases. For example, when storing multiple bits of information in each memory cell (i.e., Multi-Level Cell (MLC) products such as 2 bit/cell products, 3 bit/cell (i.e., TLC) products, 4 bit/cell products and so on) the read margin valleys between various Vt states become smaller and smaller because the overall read margin window is the same for a particular technology (lithography) node. Lithographic scaling, e.g., moving from the 34 nm to 25 nm to 21 nm nodes and so on, is also understood to increase the above described adverse effects.

In order to eliminate performance issues related to these adverse effects, embodiments of the invention may utilize pre-determined read reference voltage offsets when data read errors occur. Read reference voltage R 150 may be shifted towards a specific configuration state distribution when errors occur during read operations. As mentioned above, having a read reference voltage fixed to one value throughout the life of a NAND device, as in the prior art, limits the lifetime of the product when the read channel gets altered to an extent that a large number of cells, say greater than the number correctable with an ECC scheme, fail even though there is still some read margin window left (see, e.g., margins 180 and 185 in FIG. 1A and FIG. 1B, respectively).

Figure 2A:
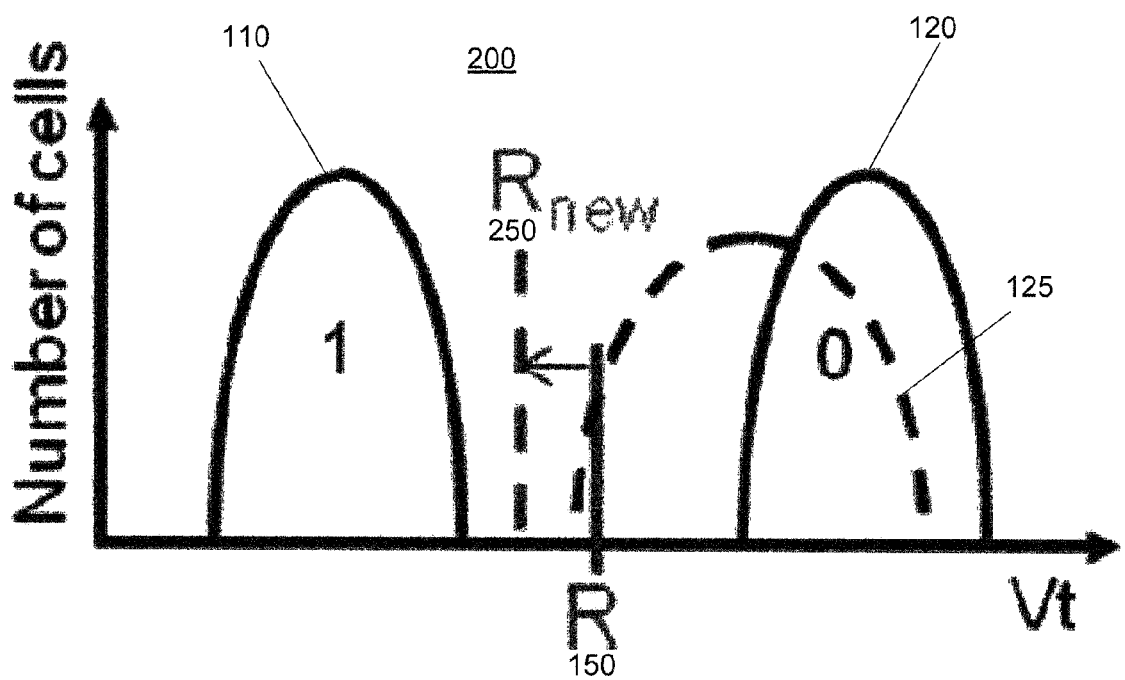
FIG. 2A and FIG. 2B are diagrams illustrating the read reference voltage adjustments enabled by embodiments of the invention.
Figure 2B:
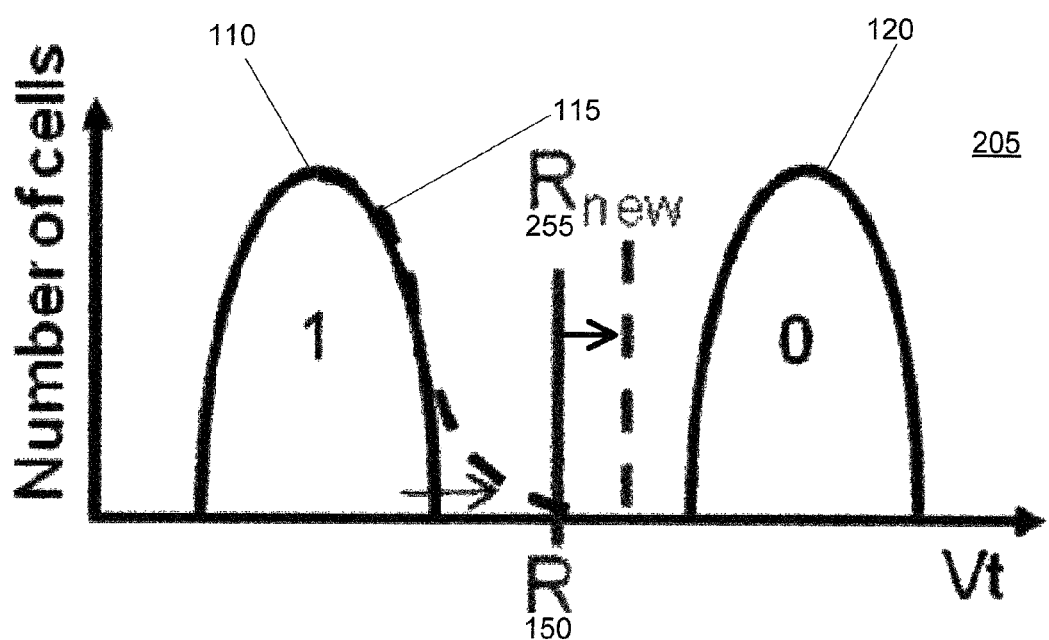

FIG. 2A and FIG. 2B are diagrams illustrating the read reference voltage adjustments enabled by embodiments of the invention. Embodiments of the invention may optimally adjust a read reference voltage to the center of the read margin valley as the Vt distributions shift with usage, or, in other words, calibrate the read channel dynamically as the product is being used. Thus, as shown in graph 200, in the presence of skewed programmed curve 125, adjusted read reference voltage $R_{NEW}$ 250 may be utilized by the NAND device. In the presence of widened erased curve 115 as shown in graph 205, adjusted read reference voltage $R_{NEW}$ 255 may be used.

Thus, in this example, read reference voltage R 150 used for read operations in a non-volatile memory may be adjusted up or down, when errors during a read operation are detected. In this embodiment, $R_{NEW}$ 250 is shown to be adjusted towards erased curve 110, while $R_{NEW}$ 255 is shown to be adjusted towards programmed curve 120. If correctable errors are present during a read operation, embodiments of the invention may determine whether there are more errors in one direction than the other (e.g., beyond a given threshold). In this scenario, the reference voltage may be adjusted by a pre-determined value in an attempt to make that difference closer to zero for subsequent reads. If uncorrectable errors are present during a read operation, embodiments of the invention may not be able to determine whether there are more errors in one direction than the other, as the uncorrectable errors represent a failure of the ECC code; in this scenario, the reference voltage may be adjusted by a pre-determined value in order to attempt to eliminate the uncorrectable errors. If said adjustment fails, further adjustments to the read reference voltage based on other pre-determined values may be adjusted (e.g., in the presence of uncorrectable errors, $R_{NEW}$ 250 may first be used, and if uncorrectable errors still exist, $R_{NEW}$ 255 may be used).

It is understood that for MLC products, where there are multiple reference voltages for each cell, each reference voltage may be adjusted separately.

Figure 3:
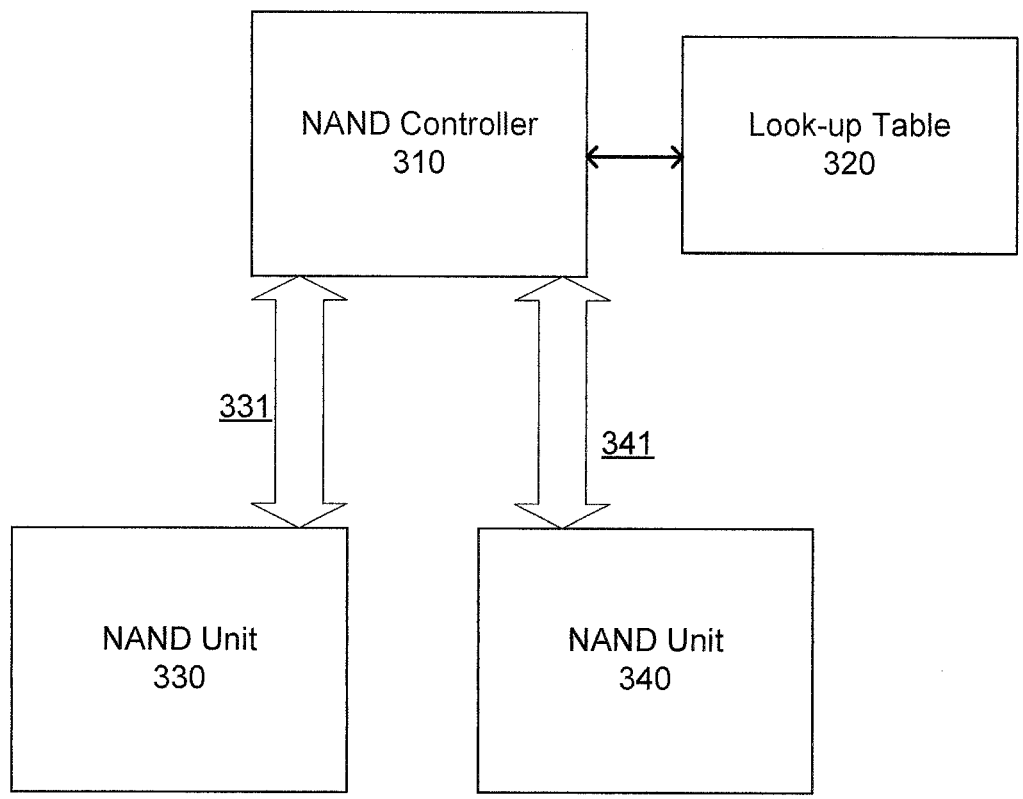
FIG. 3 is a block diagram of an embodiment of the invention.

FIG. 3 is a block diagram of an embodiment of the invention. In this embodiment, memory system 300 comprises NAND memory units 330 and 340. Examples of memory system 300 may include, but are not limited to, Solid State Drives (SSDs), and Removable Media such as USB keys, memory cards/sticks and SD cards. NAND controller 310 may be used to control operational functionality of NAND memory units 330 and 340. NAND controller 310 may comprise logic, modules, or any combination of both (it is to be understood that said Removable Media may include all of memory system 300, or may include NAND memory units 330 and 340 operatively coupled to a host system that includes NAND controller 310).

NAND memory units 330 and 340 may return data for read requests via buses 331 and 341 respectively. As described above, read data may be verified via ECC code, and NAND controller 310 may adjust the read reference voltages based on the results of ECC verification operations. In this embodiment, adjustments to the read reference voltages are based on pre-determined values stored in Lookup Table (LUT) 320.

In one embodiment, read reference voltages for NAND memory units 330 and 340 are adjusted only during ECC failures—i.e., when the ECC code fails to correct a codeword (ECC fatal conditions). ECC failures may trigger a special algorithm at the system level that tries moving the read reference voltage level around in an attempt to move the read reference towards the middle of the read margin valley and get the code-word to pass ECC verification operations. It is to be understood that in this scenario, the effective read time is longer than a simple single read without uncorrectable errors, thus degrading performance if the procedure is invoked often. ECC based triggers may help offset potential performance degradation by minimizing the frequency at which the calibration procedure is invoked.

Thus, in this embodiment, read reference voltages for NAND memory units 330 and 340 may be stepped through a fixed list of predetermined settings to see if one of the settings results in the ECC engine being able to correct the codeword. LUT 320 may include settings that are pre-determined based on a detailed characterization and an understanding of how the memory cells of a particular technology node behave with usage.

In one embodiment of the invention, system 300 moves the read reference voltage for NAND memory units 330 and 340 towards the center of the valley between two memory cell configured states when fewer number of bits (than the system ECC is designed for) in a codeword fail. This may be done periodically after a specific number of page reads or with some similar trigger condition. It is to be understood that this embodiment may help keep the channel closer to calibration even with lighter usage or near the threshold number of errors for the implemented ECC algorithm, and also improve ECC performance of the system with heavier usage. Some key parameters that embodiments may use for optimization are the number of ECC bits at which an adjustment is triggered, the amount the read reference voltage(s) are shifted (e.g., the values stored in LUT 320), and the algorithm related to the direction the read reference is shifted upon each trigger.

In one embodiment, LUT 320 values are determined based on Intrinsic Charge Loss (ICL), where the Vt distributions for configured states widen slightly and shift down after prolonged program-erase cycling and storage. It is to be understood that this embodiment is especially useful in MLC products, because typically all of the programmed levels shift down, thus said embodiment maintains a positive read margin valley between adjacent programmed states. In another embodiment, LUT 320 values are determined based on Program Disturb (PD), which disturbs a small fraction of erased cells to higher Vt values when other cells in the NAND block are programmed (which may result in a tail, as shown in widened erase curve 115 in FIGS. 1-2).

Memory system controller 310 may use a variety of mechanisms to adjust the read reference voltage level(s) and re-read with new value(s). In one embodiment, a special set feature command to retry the read may be issued to the appropriate NAND memory unit. In another embodiment, a special test-mode that will take in an input value indicating to the NAND unit the amount by which the read reference of interest is to be shifted by (i.e., controller 310 would feed in LUT 320 offsets from factory default read reference values rather than absolute values for new read reference levels).

In addition to the LUT embodiment of FIG. 3, embodiments of the invention may shift the read reference voltage in different ways. In one embodiment for SLC cells, if an ECC fatal condition occurs, the read reference is shifted up and down with ever-increasing steps till the codeword passes with ECC (for MLC cells, which have multiple read references to distinguish multiple bits stored in a cell, a more complex adjustment scheme may need to be utilized).

Figure 4:
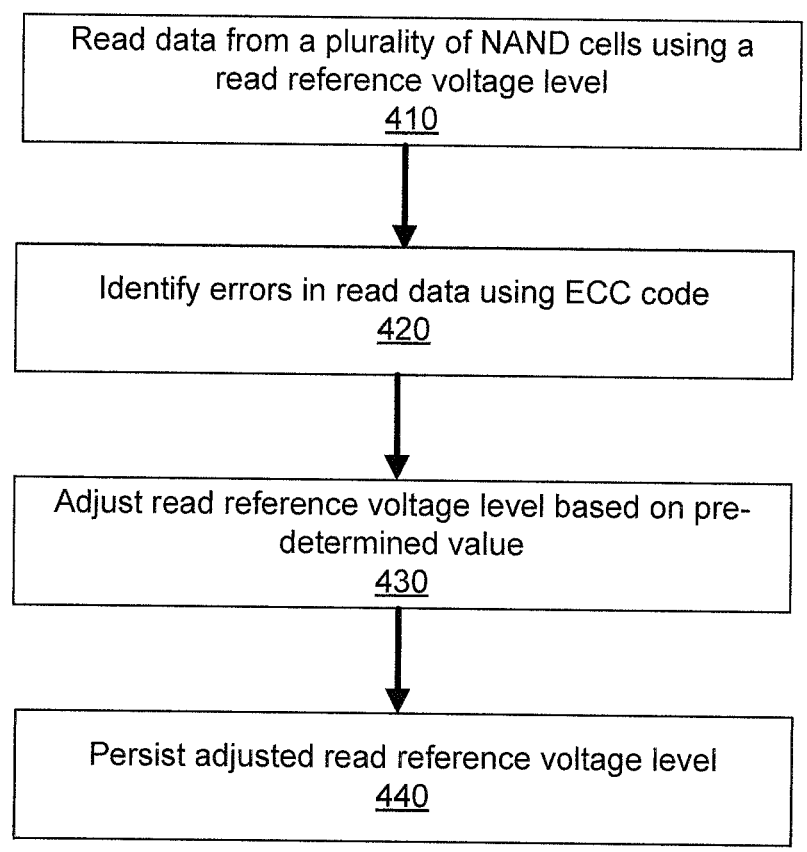
FIG. 4 is a flow diagram illustrating an embodiment of the invention.

FIG. 4 is a flow diagram illustrating an embodiment of the invention. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

In this embodiment, data from a plurality of NAND memory cells is read using a first read reference voltage level, 410. Said data includes corresponding ECC code. The system implemented ECC algorithm is executed on the data to identify errors in the data, 420.

In response to identifying errors in the data, a stored value is retrieved to adjust the first read reference voltage level to a second read reference voltage level, 430. In one embodiment, when the errors identified via the ECC algorithm are uncorrectable errors, the data from the plurality of NAND memory cells is re-read using the second read reference voltage level. The respective ECC algorithm is executed on the re-read data to identify errors in the data; if there are no more uncorrectable errors, no further adjustments are made, otherwise adjustments may be made until the read operation "passes" or the pre-determined values are exhausted. In one embodiment, the pre-determined offsets to the read reference voltage level comprise pairs of complementary adjustments (e.g., for SLC cells, adjustments moving the read reference voltage in equal values towards the '0' and '1' state).

In another embodiment, when the ECC algorithm detects correctable errors, it is determined which memory cell configured state corresponds to the most errors identified and corrected via the ECC algorithm. The retrieved stored value to adjust the read reference voltage level is based, at least in part, on this determined memory cell configured state.

In the example embodiment of FIG. 4, the adjusted read reference voltage is persisted in order to be used for subsequent reads, 440. In other embodiments, the adjusted read reference voltage is not persisted, or is only persisted based on certain events (e.g., persisting adjusted read reference voltages that pass previously ECC fatal occurrences, persisting adjusted read reference voltages that show a reduced amount of correctable errors).

Figure 5:
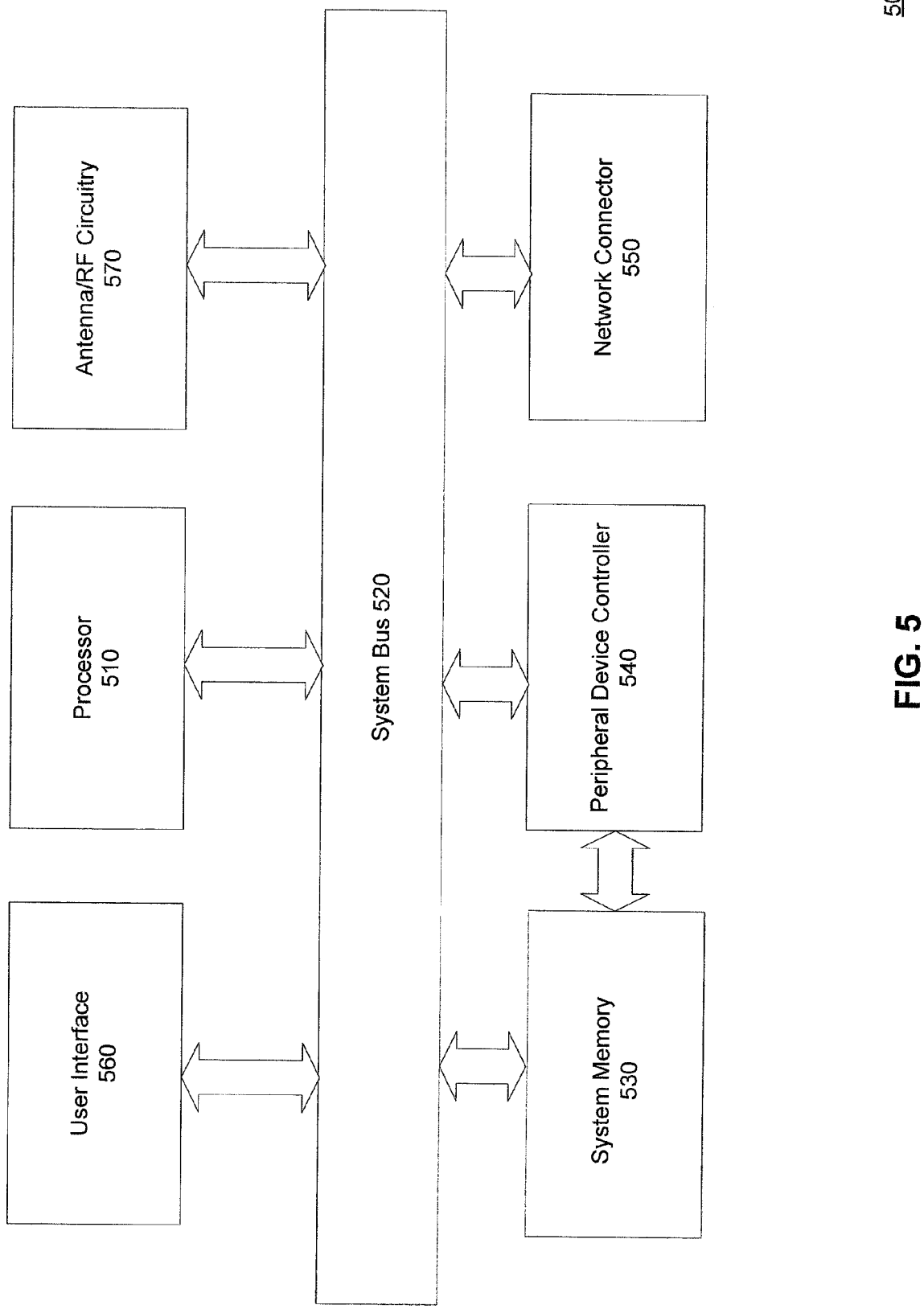
FIG. 5 is block diagram of a system that may utilize an embodiment of the invention.

FIG. 5 is block diagram of a system that may utilize an embodiment of the invention. System 500 may be included in, for example, a desktop computer, a laptop computer, a tablet computer, a netbook, a notebook computer, a personal digital assistant (PDA), a server, a workstation, a cellular telephone, a mobile computing device, an Internet appliance, an MP3 or media player or any other type of computing device.

System 500 may include processor 510 to exchange data, via system bus 520, with user interface 560, system memory 530, peripheral device controller 540 and network connector 550. System memory 530 comprises volatile and non-volatile memory and may comprise non-volatile memory units (e.g., NOR, NAND) according to any of the above described embodiments of the invention wherein the units' read reference voltage may be adjusted. Thus, system 500 will have an increase in the performance and reliability for reads to system memory 530 compared to systems employing prior art system memory solutions.

System 500 may further include antenna and RF circuitry 570 to send and receive signals to be processed by the various elements of system 500. The above described antenna may be a directional antenna or an omni-directional antenna. As used herein, the term omni-directional antenna refers to any antenna having a substantially uniform pattern in at least one plane. For example, in some embodiments, said antenna may be an omni-directional antenna such as a dipole antenna, or a quarter wave antenna. Also for example, in some embodiments, said antenna may be a directional antenna such as a parabolic dish antenna, a patch antenna, or a Yagi antenna. In some embodiments, system 500 may include multiple physical antennas.

While shown to be separate from network connector 550, it is to be understood that in other embodiments, antenna and RF circuitry 570 may comprise a wireless interface to operate in accordance with, but not limited to, the IEEE 802.11 standard and its related family, Home Plug AV (HPAV), Ultra Wide Band (UWB), Bluetooth, WiMax, or any other form of wireless communication protocol.

Various components referred to above as processes, servers, or tools described herein may be a means for performing the functions described. Each component described herein includes software or hardware, or a combination of these. Each and all components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration) may be provided via an article of manufacture including a non-transitory, tangible computer or machine readable storage medium, which provides content that represents instructions that can be executed. The content may result in a computer performing various functions/operations described herein.

A computer readable non-transitory storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable non-transitory storage medium may also include a storage or database from which content can be downloaded. Said computer readable medium may also include a device or product having content stored thereon at a time of sale or delivery. Thus, delivering a device with stored content, or offering content for download over a communication medium may be understood as providing an article of manufacture with such content described herein.

The invention claimed is:

1. A method comprising:
 tracking a number of successful reads performed on a memory device, wherein a successful read on the memory device comprises:
  reading data from a plurality of flash memory cells included in a memory device using a first read reference voltage level; and
  performing an error checking and correction (ECC) algorithm on the data to identify no errors or errors in the data that are correctable via the ECC algorithm; and
 in response to the number of successful reads performed on the memory device exceeding a threshold value comprising a specific number of performed reads, retrieving a stored value to adjust the first read reference voltage level to a second read reference voltage level, wherein the stored value is included in a look-up table (LUT).

2. The method of claim 1, further comprising:
 in response to identifying uncorrectable errors in for read operations using the second read reference voltage level, retrieving a third stored value to adjust the second read reference voltage level to a third read reference voltage level.

3. The method of claim 2, wherein the retrieved stored value and the second retrieved stored value comprise complementary offsets to the first read reference voltage level.

4. The method of claim 1, further comprising persisting the second read reference voltage level to use with subsequent data reads to the plurality of flash memory cells.

5. An article of manufacture comprising a non-transitory machine-readable storage medium that provides instructions that, if executed by the machine, will cause the machine to perform operations comprising:
 tracking a number of successful reads performed on a memory device, wherein a successful read on the memory device comprises:
  reading data from a plurality of flash memory cells included in a memory device using a first read reference voltage level; and
  performing an error checking and correction (ECC) algorithm on the data to identify no errors or errors in the data that are correctable via the ECC algorithm; and
 in response to the number of successful reads performed on the memory device exceeding a threshold value comprising a specific number of performed reads, retrieving a stored value to adjust the first read reference voltage level to a second read reference voltage level, wherein the stored value is included in a look-up table (LUT).

6. The article of manufacture of claim 5, the machine to perform operations further comprising:
 in response to identifying uncorrectable errors in for read operations using the second read reference voltage level, retrieving a third stored value to adjust the second read reference voltage level to a third read reference voltage level.

7. The article of manufacture of claim 6, wherein the retrieved stored value and the second retrieved stored value comprise complementary offsets to the first read reference voltage level.

8. The article of manufacture of claim 5, further comprising persisting the second read reference voltage level to use with subsequent data reads to the plurality of flash memory cells.

9. A system comprising:
 a flash memory device; and
 a flash memory controller to
  track a number of successful reads performed on a memory device, wherein a successful read on the memory device comprises:
   read data from a plurality of flash memory cells included in a memory device using a first read reference voltage level; and perform an error checking and correction (ECC) algorithm on the data to identify no errors or errors in the data that are correctable via the ECC algorithm; and in response to the number of successful reads performed on the memory device exceeding a threshold value comprising a specific number of performed reads, retrieve a stored value to adjust the first read reference voltage level to a second read reference voltage level, wherein the stored value is included in a look-up table (LUT).

10. The system of claim 9, the flash memory unit to further:

in response to identifying uncorrectable errors for read operations using the second read reference voltage level, retrieve a third stored value to adjust the second read reference voltage level to a third read reference voltage level.

11. The system of claim 10, wherein the retrieved stored value and the second retrieved stored value comprise complementary offsets to the first read reference voltage level.

12. The system of claim 9, the flash memory controller to further persist the second read reference voltage level to use with subsequent data reads to the plurality of flash memory cells.

13. The system of claim 9, further comprising:

an antenna; and radio frequency circuitry coupled to the antenna to receive signal data to be stored on the flash memory device.

* * * * *